US012603144B2

(12) United States Patent
Wu et al.

(10) Patent No.: US 12,603,144 B2
(45) Date of Patent: Apr. 14, 2026

(54) BLOCK HEALTH DETECTOR FOR BLOCK RETIREMENT IN A MEMORY SUB-SYSTEM

(71) Applicant: Micron Technology, Inc., Boise, ID (US)

(72) Inventors: Fanqi Wu, Sunnyvale, CA (US); Kevin R. Brandt, Boise, ID (US); Zhenlei Shen, Milpitas, CA (US); Tingjun Xie, Milpitas, CA (US); Yang Liu, San Jose, CA (US); Jiangli Zhu, San Jose, CA (US)

(73) Assignee: Micron Technology, Inc., Boise, ID (US)

( * ) Notice: Subject to any disclaimer, the term of this patent is extended or adjusted under 35 U.S.C. 154(b) by 92 days.

(21) Appl. No.: 18/749,234

(22) Filed: Jun. 20, 2024

(65) Prior Publication Data

US 2025/0022529 A1     Jan. 16, 2025

Related U.S. Application Data

(60) Provisional application No. 63/526,414, filed on Jul. 12, 2023.

(51) Int. Cl.
G11C 29/44 (2006.01)
(52) U.S. Cl.
CPC .................................... G11C 29/44 (2013.01)
(58) Field of Classification Search
CPC ......... G11C 29/42; G11C 29/44; G11C 29/52; G06F 11/1068; G06F 3/0688; G06F 3/0649; G06F 3/0608; G06F 3/064
See application file for complete search history.

(56) References Cited

U.S. PATENT DOCUMENTS

| | | |
|---|---|---|
| 2006/0259814 A1 | 11/2006 | Korhonen |
| 2007/0294588 A1 | 12/2007 | Coulson |
| 2010/0058119 A1* | 3/2010 | Reid .................... G11C 16/349 |
| | | 714/E11.026 |
| 2015/0309857 A1 | 10/2015 | Weilemann, II et al. |
| 2019/0391752 A1* | 12/2019 | Pletka ................... G06F 3/0616 |
| 2021/0173754 A1 | 6/2021 | Dalmatov |
| 2021/0334035 A1 | 10/2021 | Sheperek et al. |

OTHER PUBLICATIONS

International Search Report and Written Opinion for International Application No. PCT/US2024/035661, mailed Oct. 24, 2024, 09 pages.

* cited by examiner

*Primary Examiner* — Shelly A Chase
(74) *Attorney, Agent, or Firm* — Lowenstein Sandler LLP

(57) ABSTRACT

A processing device in a memory sub-system identifies a read error associated with a block and initiates a diagnostic memory access operation on the block. The processing device determines whether the diagnostic memory access operation was successfully performed on the block. Responsive to determining the diagnostic memory access operation was successfully performed on the block, the processing device initiates a diagnostic read operation on the block. The processing device determines whether the diagnostic read operation was successfully performed on the block. Responsive to determining the diagnostic read operation was successfully performed on the block, the processing device identifies the block as a healthy block.

20 Claims, 5 Drawing Sheets

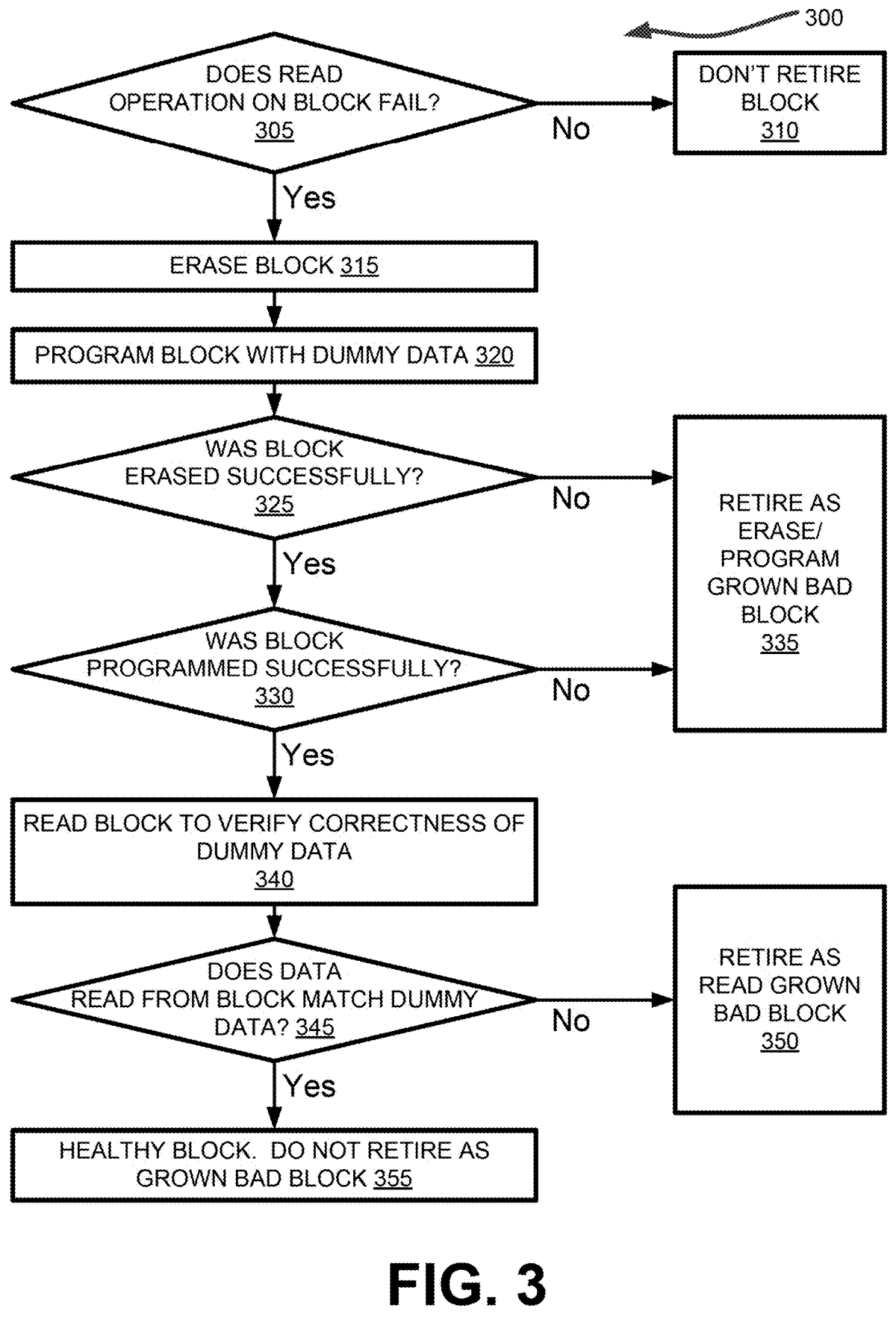

300

DOES READ OPERATION ON BLOCK FAIL? 305 → No → DON'T RETIRE BLOCK 310

Yes

ERASE BLOCK 315

PROGRAM BLOCK WITH DUMMY DATA 320

WAS BLOCK ERASED SUCCESSFULLY? 325 → No →

Yes

WAS BLOCK PROGRAMMED SUCCESSFULLY? 330 → No → RETIRE AS ERASE/ PROGRAM GROWN BAD BLOCK 335

Yes

READ BLOCK TO VERIFY CORRECTNESS OF DUMMY DATA 340

DOES DATA READ FROM BLOCK MATCH DUMMY DATA? 345 → No → RETIRE AS READ GROWN BAD BLOCK 350

Yes

HEALTHY BLOCK. DO NOT RETIRE AS GROWN BAD BLOCK 355

FIG. 3

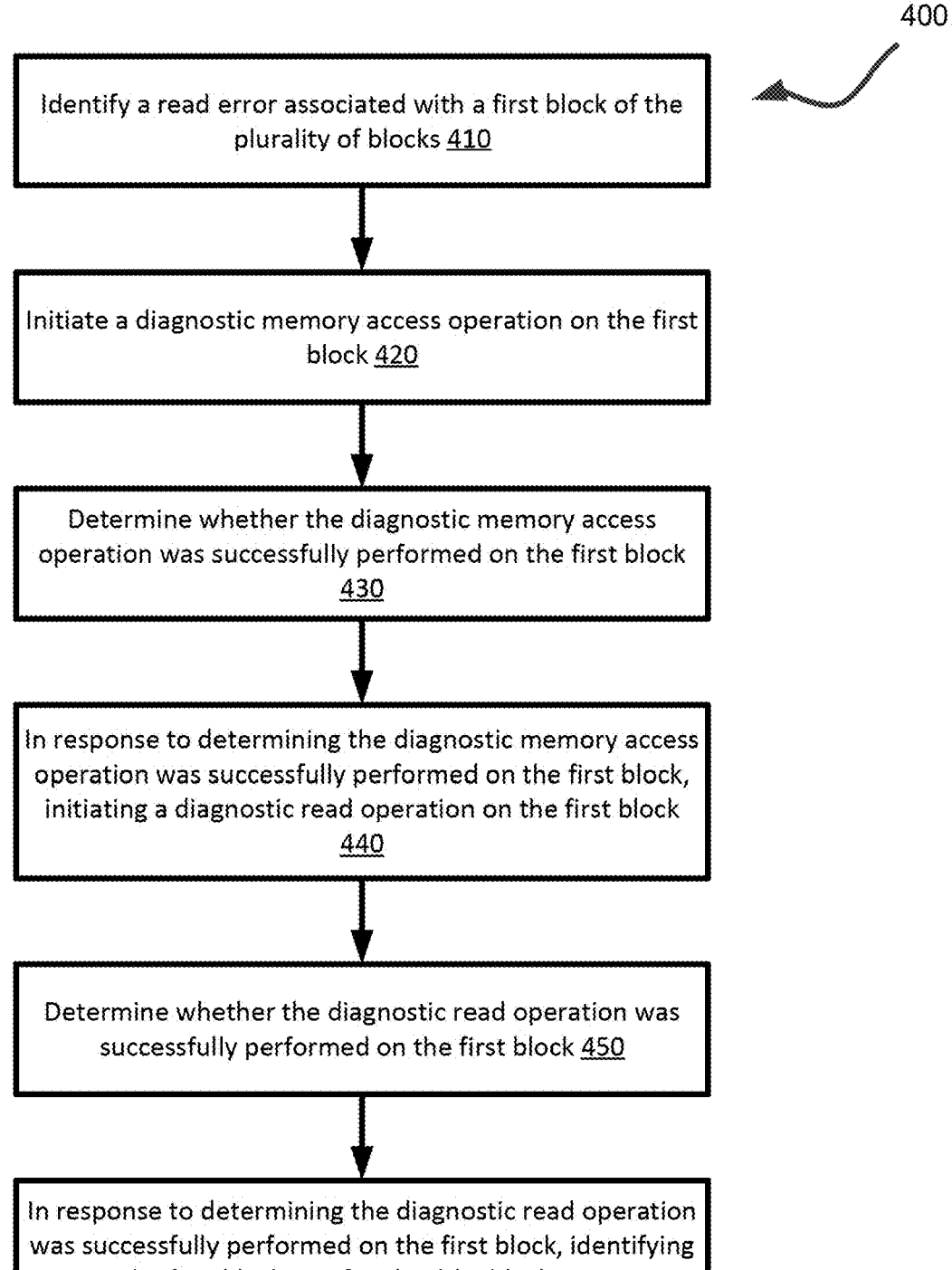

400

Identify a read error associated with a first block of the plurality of blocks 410

Initiate a diagnostic memory access operation on the first block 420

Determine whether the diagnostic memory access operation was successfully performed on the first block 430

In response to determining the diagnostic memory access operation was successfully performed on the first block, initiating a diagnostic read operation on the first block 440

Determine whether the diagnostic read operation was successfully performed on the first block 450

In response to determining the diagnostic read operation was successfully performed on the first block, identifying the first block as a first healthy block 460

FIG. 4

BLOCK HEALTH DETECTOR FOR BLOCK RETIREMENT IN A MEMORY SUB-SYSTEM

RELATED APPLICATION

This application claims the benefit of U.S. Provisional Application No. 63/526,414 filed Jul. 12, 2023, the entire contents of which are hereby incorporated by reference.

TECHNICAL FIELD

Embodiments of the disclosure relate generally to memory sub-systems, and more specifically, relate to a block health detector for block retirement in a memory sub-system.

BACKGROUND

A memory sub-system can include one or more memory devices that store data. The memory devices can be, for example, non-volatile memory devices and volatile memory devices. In general, a host system can utilize a memory sub-system to store data at the memory devices and to retrieve data from the memory devices.

BRIEF DESCRIPTION OF THE DRAWINGS

The present disclosure will be understood more fully from the detailed description given below and from the accompanying drawings of various embodiments of the disclosure.

FIG. 3 is a flow diagram of an example method of identifying healthy blocks in a memory sub-system with an EPR operation, in accordance with some embodiments of the present disclosure.

FIG. 4 is a flow diagram of an example method of identifying healthy blocks in a memory sub-system in accordance with some embodiments of the present disclosure.

DETAILED DESCRIPTION

Figure 1:
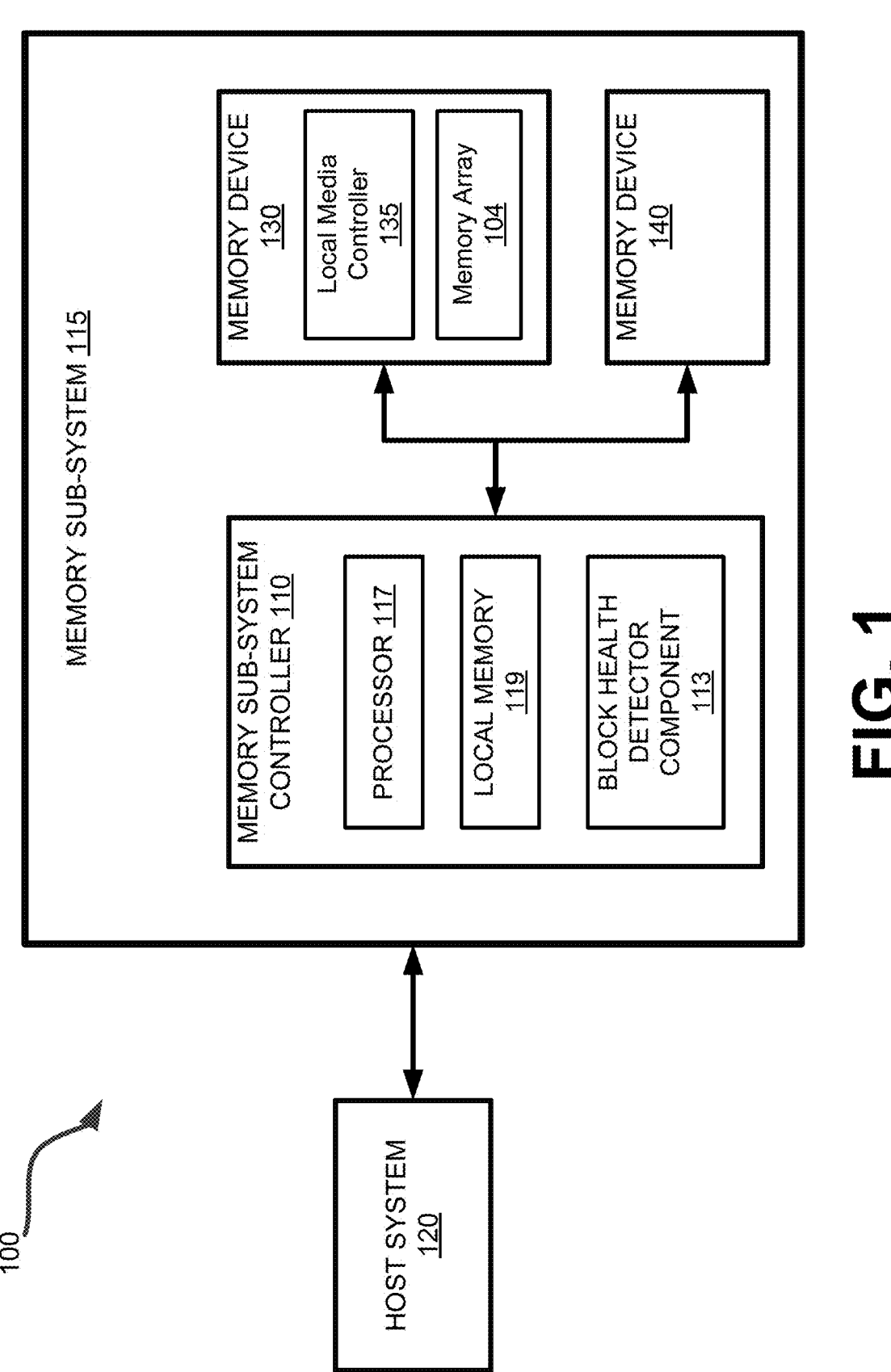
FIG. 1 illustrates an example computing system that includes a memory sub-system in accordance with some embodiments of the present disclosure.

Aspects of the present disclosure are directed to a block health detector for block retirement in a memory sub-system. A memory sub-system can be a storage device, a memory module, or a hybrid of a storage device and memory module. Examples of storage devices and memory modules are described below in conjunction with FIG. 1. In general, a host system can utilize a memory sub-system that includes one or more components, such as memory devices that store data. The host system can provide data to be stored at the memory sub-system and can request data to be retrieved from the memory sub-system.

A memory sub-system can include high density non-volatile memory devices where retention of data is desired when no power is supplied to the memory device. For example, NAND memory, such as 3D flash NAND memory, offers storage in the form of compact, high density configurations. A non-volatile memory device is a package of one or more dice, each including one or more planes. For some types of non-volatile memory devices (e.g., NAND memory), each plane includes of a set of physical blocks. Each block includes of a set of pages. Each page includes of a set of memory cells ("cells"). A cell is an electronic circuit that stores information. Depending on the cell type, a cell can store one or more bits of binary information, and has various logic states that correlate to the number of bits being stored. The logic states can be represented by binary values, such as "0" and "1", or combinations of such values.

A memory device can be made up of bits arranged in a two-dimensional or a three-dimensional grid. Memory cells are formed onto a silicon wafer in an array of columns (also hereinafter referred to as bitlines) and rows (also hereinafter referred to as wordlines). A wordline can refer to one or more rows of memory cells of a memory device that are used with one or more bitlines to generate the address of each of the memory cells. The intersection of a bitline and wordline constitutes the address of the memory cell. A block hereinafter refers to a unit of the memory device used to store data and can include a group of memory cells, a wordline group, a wordline, or individual memory cells. One or more blocks can be grouped together to form separate partitions (e.g., planes) of the memory device in order to allow concurrent operations to take place on each plane.

One example of a memory sub-system is a solid-state drive (SSD) that includes one or more non-volatile memory devices and a memory sub-system controller to manage the non-volatile memory devices. A given segment of one of those memory devices (e.g., a block) can be characterized based on the programming state of the memory cells associated with wordlines contained within the segment. When data is written to a memory cell of the segment for storage, the memory cell can deteriorate. This can cause the memory sub-system to experience a read failure at the memory cell or segment of memory (e.g., a block). Three mechanisms that potentially lead to read failure include: intrinsic NAND defect, intrinsic cell degradation, and extrinsic media stress. An "intrinsic NAND defect" can include physical defects to the segment of memory due to, for example manufacturing errors or damage sustained at the location where the memory sub-system is operating (e.g., damage sustained by the memory sub-system from being dropped). "Intrinsic cell degradation" can include memory segments that, due to repeated memory access operations (e.g., program/erase cycling) can no longer reliably store data. Accordingly, each memory cell of the segment can handle a finite number of memory operations performed before the memory cell is no longer able to reliably store data. "Extrinsic media stress" can include stresses on the segment of memory due to a number of factors, read disturb, slow charge loss, the passage of time, change in temperature, etc. For example, when data has been stored in the memory cells of a block for an extended period of time (e.g., in a datacenter), so called "data retention" stress can lead to significant levels of charge loss during that period of time.

When performing certain memory access operations, the algorithms of the memory sub-system controller can attempt to read the data in one or more blocks of the drive, but may fail because the block due to physical defect (e.g., an intrinsic NAND defect or intrinsic cell degradation), or a logical defect (e.g., extrinsic media stress that alters the charge states of the memory cells in the block). Altered charge states of memory cells in the block can include charge loss. For example, the charge loss can cause the margins between programming distributions to collapse making the data in different memory cells unreadable.

However, some memory sub-systems are unable to distinguish between the different mechanisms that can cause read failures, and instead simply retire all blocks with a read failure as read grown bad blocks (GBBs). GBBs are "bad blocks" that have experienced intrinsic cell degradation. Bad blocks are blocks that do not reliably store data due to a physical defect, such as blocks with intrinsic NAND defects, and blocks with intrinsic cell degradation (e.g., GBBs). A block that causes a read failure (e.g., due to extrinsic media stress) that can be reformatted and reused is not a bad block. Accordingly, memory sub-systems can be forced to retire any block that meets a defined bad block criterion (e.g., blocks for which certain uncorrectable error handling steps are triggered), even though such blocks might be intrinsically good blocks that could be reformatted and reused. This can detrimentally impact the capacity and lifespan of the drive. In a particular example, blocks on drives which are operating beyond defined specifications of the drive (which may dictate a certain time period and temperature range for which the data is still recoverable), might experience a higher quantity of read failures. While data stored on the drives may be unrecoverable, it might be practical for certain users/customers to reformat and reuse the drives with new programmed data.

Aspects of the present disclosure address the above and other deficiencies by utilizing a block health detector for block retirement in the memory sub-system. The block health detector can allow blocks that suffered a read error, but are determined to be otherwise healthy, to be reformatted and reused (e.g., erased and reprogrammed with new data). Healthy blocks are physical blocks of the memory device that are capable of reliably storing data despite suffering a read error (i.e., a failure to reliably store the current data (or most recently stored data) due to extrinsic media stress). After an error corresponding to a block of the memory device is detected in the memory sub-system, the block health detector can determine whether the block is a healthy block (e.g., capable of reliably storing data) or a bad block (e.g., not capable of reliably storing data). Bad blocks can include grown bad blocks (GBBs) which, as described above, are blocks that have become bad blocks due to stresses from repeated use (e.g., repeated memory access operations). To determine if the block associated with the error is a healthy block, the block health detector can attempt to perform a diagnostic memory access operation (e.g., a program operation or erase operation) on the block. If the memory sub-system indicates the diagnostic memory access operation was successful, the block health detector can attempt to perform a diagnostic read operation on the block. If the memory sub-system indicates the diagnostic memory access operation was not successful, the block can be identified as a retirement candidate. If the diagnostic read operation was successful the block health detector can identify the block as a healthy block. If the diagnostic read operation was not successful, the block health detector can identify the block as a retirement candidate.

Advantages of the approach described herein includes, but is not limited to, improved performance in the memory sub-system. For example, the block health detector for block retirement can support certain customer usage modes by allowing reformatting and reuse of blocks in the memory sub-system after long periods data retention. The block health detector can prevent unnecessary retirement of intrinsically good blocks which increases capacity and lifespan of the memory sub-system. In addition, the techniques described herein preserve system resources by reducing the number of blocks that may be miscategorized as GBBs during operation of the memory sub-system, and avoid over-provisioning loss due to unnecessary block retirement.

FIG. 1 illustrates an example computing system 100 that includes a memory sub-system 110 in accordance with some embodiments of the present disclosure. The memory sub-system 110 can include media, such as one or more volatile memory devices (e.g., memory device 140), one or more non-volatile memory devices (e.g., one or more memory device(s) 130), or a combination of such.

A memory sub-system 110 can be a storage device, a memory module, or a hybrid of a storage device and memory module. Examples of a storage device include a solid-state drive (SSD), a flash drive, a universal serial bus (USB) flash drive, an embedded Multi-Media Controller (eMMC) drive, a Universal Flash Storage (UFS) drive, a secure digital (SD) card, and a hard disk drive (HDD). Examples of memory modules include a dual in-line memory module (DIMM), a small outline DIMM (SO-DIMM), and various types of non-volatile dual in-line memory modules (NVDIMMs).

The computing system 100 can be a computing device such as a desktop computer, laptop computer, network server, mobile device, a vehicle (e.g., airplane, drone, train, automobile, or other conveyance), Internet of Things (IoT) enabled device, embedded computer (e.g., one included in a vehicle, industrial equipment, or a networked commercial device), or such computing device that includes memory and a processing device.

The computing system 100 can include a host system 120 that is coupled to one or more memory sub-systems 110. In some embodiments, the host system 120 is coupled to different types of memory sub-system 110. FIG. 1 illustrates one example of a host system 120 coupled to one memory sub-system 110. As used herein, "coupled to" or "coupled with" generally refers to a connection between components, which can be an indirect communicative connection or direct communicative connection (e.g., without intervening components), whether wired or wireless, including connections such as electrical, optical, magnetic, etc.

The host system 120 can include a processor chipset and a software stack executed by the processor chipset. The processor chipset can include one or more cores, one or more caches, a memory controller (e.g., NVDIMM controller), and a storage protocol controller (e.g., PCIe controller, SATA controller). The host system 120 uses the memory sub-system 110, for example, to write data to the memory sub-system 110 and read data from the memory sub-system 110.

The host system 120 can be coupled to the memory sub-system 110 via a physical host interface. Examples of a physical host interface include, but are not limited to, a serial advanced technology attachment (SATA) interface, a peripheral component interconnect express (PCIe) interface, universal serial bus (USB) interface, Fibre Channel, Serial Attached SCSI (SAS), a double data rate (DDR) memory bus, Small Computer System Interface (SCSI), a dual in-line memory module (DIMM) interface (e.g., DIMM socket interface that supports Double Data Rate (DDR)), etc. The physical host interface can be used to transmit data between the host system 120 and the memory sub-system 110. The host system 120 can further utilize an NVM Express (NVMe) interface to access the memory components (e.g., the one or more memory device(s) 130) when the memory sub-system 110 is coupled with the host system 120 by the PCIe interface. The physical host interface can provide an interface for passing control, address, data, and other signals between the memory sub-system 110 and the host system 120. FIG. 1 illustrates a memory sub-system 110 as an example. In general, the host system 120 can access multiple memory sub-systems via a same communication connection, multiple separate communication connections, and/or a combination of communication connections.

The memory devices 130, 140 can include any combination of the different types of non-volatile memory devices and/or volatile memory devices. The volatile memory devices (e.g., memory device 140) can be, but are not limited to, random access memory (RAM), such as dynamic random access memory (DRAM) and synchronous dynamic random access memory (SDRAM).

Some examples of non-volatile memory devices (e.g., memory device(s) 130) include not-and (NAND) type flash memory and write-in-place memory, such as three-dimensional cross-point ("3D cross-point") memory. A cross-point array of non-volatile memory can perform bit storage based on a change of bulk resistance, in conjunction with a stackable cross-gridded data access array. Additionally, in contrast to many flash-based memories, cross-point non-volatile memory can perform a write in-place operation, where a non-volatile memory cell can be programmed without the non-volatile memory cell being previously erased. NAND type flash memory includes, for example, two-dimensional NAND (2D NAND) and three-dimensional NAND (3D NAND).

Each of the memory device(s) 130 can include one or more arrays of memory cells. One type of memory cell, for example, single level cells (SLC) can store one bit per cell. Other types of memory cells, such as multi-level cells (MLCs), triple level cells (TLCs), and quad-level cells (QLCs), can store multiple bits per cell. In some embodiments, each of the memory devices 130 can include one or more arrays of memory cells such as SLCs, MLCs, TLCs, QLCs, or any combination of such. In some embodiments, a particular memory device can include an SLC portion, and an MLC portion, a TLC portion, or a QLC portion of memory cells. The memory cells of the memory devices 130 can be grouped as pages that can refer to a logical unit of the memory device used to store data. With some types of memory (e.g., NAND), pages can be grouped to form blocks.

Although non-volatile memory components such as a 3D cross-point array of non-volatile memory cells and NAND type flash memory (e.g., 2D NAND, 3D NAND) are described, the memory device 130 can be based on any other type of non-volatile memory, such as read-only memory (ROM), phase change memory (PCM), self-selecting memory, other chalcogenide based memories, ferroelectric transistor random-access memory (FeTRAM), ferroelectric random access memory (FeRAM), magneto random access memory (MRAM), Spin Transfer Torque (STT)-MRAM, conductive bridging RAM (CBRAM), resistive random access memory (RRAM), oxide based RRAM (OxRAM), not-or (NOR) flash memory, electrically erasable programmable read-only memory (EEPROM).

A memory sub-system controller 115 (or controller 115 for simplicity) can communicate with the memory device(s) 130 to perform operations such as reading data, writing data, or erasing data at the memory devices 130 and other such operations. The memory sub-system controller 115 can include hardware such as one or more integrated circuits and/or discrete components, a buffer memory, or a combination thereof. The hardware can include a digital circuitry with dedicated (i.e., hard-coded) logic to perform the operations described herein. The memory sub-system controller 115 can be a microcontroller, special purpose logic circuitry (e.g., a field programmable gate array (FPGA), an application specific integrated circuit (ASIC), etc.), or other suitable processor.

The memory sub-system controller 115 can include a processor 117 (e.g., a processing device) configured to execute instructions stored in a local memory 119. In the illustrated example, the local memory 119 of the memory sub-system controller 115 includes an embedded memory configured to store instructions for performing various processes, operations, logic flows, and routines that control operation of the memory sub-system 110, including handling communications between the memory sub-system 110 and the host system 120.

In some embodiments, the local memory 119 can include memory registers storing memory pointers, fetched data, etc. The local memory 119 can also include read-only memory (ROM) for storing micro-code. While the example memory sub-system 110 in FIG. 1 has been illustrated as including the memory sub-system controller 115, in another embodiment of the present disclosure, a memory sub-system 110 does not include a memory sub-system controller 115, and can instead rely upon external control (e.g., provided by an external host, or by a processor or controller separate from the memory sub-system).

In general, the memory sub-system controller 115 can receive commands or operations from the host system 120 and can convert the commands or operations into instructions or appropriate commands to achieve the desired access to the memory device(s) 130. The memory sub-system controller 115 can be responsible for other operations such as wear leveling operations, garbage collection operations, error detection and error-correcting code (ECC) operations, encryption operations, caching operations, and address translations between a logical address (e.g., logical block address (LBA), namespace) and a physical address (e.g., physical block address) that are associated with the memory device(s) 130. The memory sub-system controller 115 can further include host interface circuitry to communicate with the host system 120 via the physical host interface. The host interface circuitry can convert the commands received from the host system into command instructions to access the memory device(s) 130 as well as convert responses associated with the memory device(s) 130 into information for the host system 120.

The memory sub-system 110 can also include additional circuitry or components that are not illustrated. In some embodiments, the memory sub-system 110 can include a cache or buffer (e.g., DRAM) and address circuitry (e.g., a row decoder and a column decoder) that can receive an address from the memory sub-system controller 115 and decode the address to access the memory device(s) 130.

In some embodiments, the memory device(s) 130 include local media controllers 135 that operate in conjunction with memory sub-system controller 115 to execute operations on one or more memory cells of the memory device(s) 130. An external controller (e.g., memory sub-system controller 115) can externally manage the memory device 130 (e.g., perform media management operations on the memory device(s) 130). In some embodiments, a memory device 130 is a managed memory device, which is a raw memory device (e.g., memory array 104) having control logic (e.g., local media controller 135) for media management within the same memory device package. An example of a managed memory device is a managed NAND (MNAND) device. Memory device(s) 130, for example, can each represent a single die having some control logic (e.g., local media controller 135) embodied thereon. In some embodiments, one or more components of memory sub-system 110 can be omitted.

In some embodiments, the memory sub-system 110 includes a block health detector component 113 that can determine whether a read failure is due to an intrinsic NAND defect (e.g., a bad block), intrinsic cell degradation (e.g., a GBB), or extrinsic media stress (e.g., change in charge over time resulting from changes in temperature, adjacent memory cell voltage levels, read disturb, etc.). In some embodiments, block health detector component 113 can identify a read error associated with a block of memory sub-system 110. Block health detector component 113 can initiate a diagnostic memory access operation on the block, and determine whether the diagnostic memory access operation was successful. If the diagnostic memory access operation was successful, block health detector component 113 can proceed to initiate a diagnostic read operation on the block. If the diagnostic read operation on the block was successful, block health detector component 113 can identify the block as a healthy block. However, if either the diagnostic memory access operation or the diagnostic read operation were unsuccessful, block health detector component 113 can identify the block as a retirement candidate. Retirement candidates can be retired by block health detector component 113, or by another component of memory sub-system 110 as needed. In some embodiments, retirement candidates can be assigned to a retirement pool in lieu of immediately retiring the block. In some embodiments, retirement candidates can be retired as a part of memory processes such as garbage collection. Identifying healthy blocks from bad blocks (e.g., GBBs) allows the healthy blocks or other segments of memory device 130 to be reformatted and reused (e.g., erased and reprogrammed with new data). Further details with regards to the operations of block health detector component 113 are described below.

Figure 2:
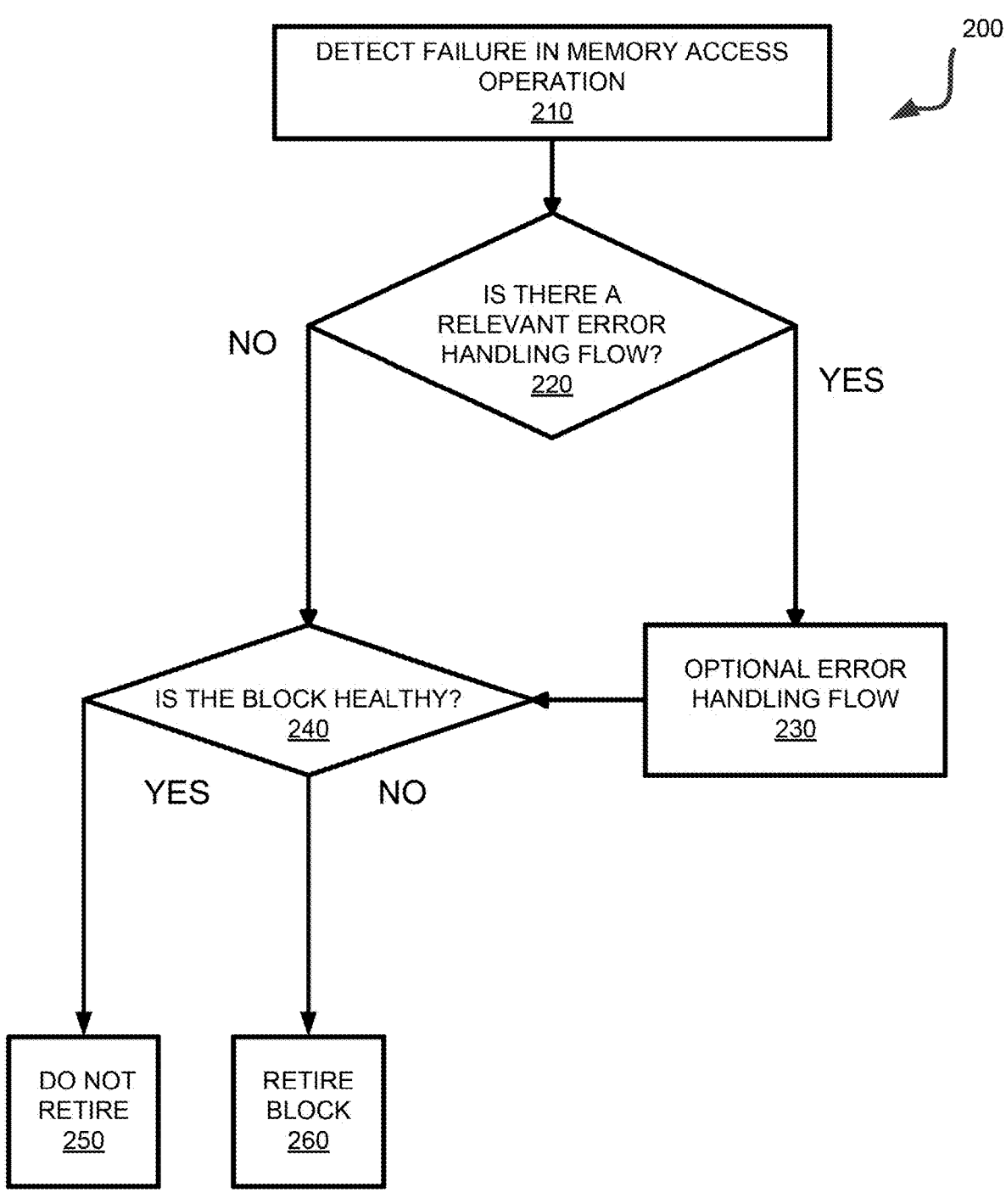
FIG. 2 is a flow diagram of an example method of identifying healthy blocks in a memory sub-system, in accordance with some embodiments of the present disclosure.

FIG. 2 is a flow diagram of an example method of identifying healthy blocks in a memory sub-system, in accordance with some embodiments of the present disclosure. The method 200 can be performed by processing logic that can include hardware (e.g., processing device, circuitry, dedicated logic, programmable logic, microcode, hardware of a device, integrated circuit, etc.), software (e.g., instructions run or executed on a processing device), or a combination thereof. In some embodiments, the method 200 is performed by block health detector component 113 of FIG. 1. Although shown in a particular sequence or order, unless otherwise specified, the order of the processes can be modified. Thus, the illustrated embodiments should be understood only as examples, and the illustrated processes can be performed in a different order, and some processes can be performed in parallel. Additionally, one or more processes can be omitted in various embodiments. Thus, not all processes are required in every embodiment. Other process flows are possible.

At operation 210, the processing logic (e.g., block health detector component 113) detects a failure in a memory access operation performed on a block of the memory sub-system 110. In some embodiments, memory access operations can perform a read strobe shortly after performing the host request (e.g., a read, program, or erase operation in response to a host request). The read strobe can return information about the voltage states of the memory cells, which can be checked against values in a database, programmed values, and/or expected voltage states. If the information returned by the read strobe does not match the expected voltage states of the memory cells, the memory sub-system 110 can indicate the block as experienced a memory access operation failure. For example, error correcting code (ECC) implemented by the memory sub-system controller 115 can examine data read from the block and identify any errors (e.g., bit-flip errors) using various techniques, such as parity information, hard and soft decoding, etc. The presence of such errors, including correctable or uncorrectable errors, can be interpreted as a failure of the memory access operation. Depending on the embodiment, the failure of the memory access operation can be the result of a read error, a write error, or an erase error. In some embodiments, processing logic can copy data stored at the block associated with the detected failure to another block to reduce loss of user data.

At operation 220, the processing logic determines, based on the memory access operation failure, whether there is a relevant error handling flow. In some embodiments, the following operation (e.g., operation 240 to determine whether the block associated with the memory access operation failure is a healthy block) can be performed in response to a termination of an error handling flow. In some embodiments, the memory sub-system 110 can enter an error handling flow in response to a memory access operation failure.

At operation 230, the processing logic enters an optional error handling flow for memory sub-system 110. In some embodiments, when an error is encountered during a read operation (e.g., a hard read failure) with respect to a memory cell (e.g., a target cell), or when a bit error rate (BER) with respect to multiple cells is exceeded, a sequence of error handling operations (or sequence of recovery steps) can be undertaken. This sequence of operations can be referred to as the error handling flow. In some embodiments, the error handling flow can include a predefined list of operations which can be sequentially performed in a set order, in an attempt correct the error or improve the bit error rate. For example, the processing logic can perform the first operation in the predefined list, determine if the first operation is successful, and if not, proceed to the second operation. The operations in the error handling flow, and the corresponding order in which they are performed, can vary depending on the implementation. In some embodiments, however, the error handling flow can include one or more uncorrectable error recovery steps.

At operation 240, the processing logic determines whether the block associated with the memory access operation failure is a healthy block. The processing logic can perform an erase-program-read (EPR) operation on the block. The first step of the EPR operation is to attempt to erase the block followed by the second step of the EPR operation to program the block with dummy data (e.g., the "erase-program" part of the EPR operation). If the memory sub-system indicates both the erase operation and the program operation were successful, processing logic can proceed to the next step in the EPR operation. The next step of the EPR operation is to read the block and determine whether the read operation returns data consistent with the program operation from the previous step. For example, in the first step of the EPR operation the block is erased and in the second step of the EPR operation the block is programmed with dummy data, and in the third step of the EPR operation, the read operation should return data that corresponds to the dummy data. If all steps of the EPR operation are successful, processing logic can proceed to operation 250 where the block is identified as a healthy block. If any step of the EPR operation is not successful, processing logic can proceed to operation 260 where the block is identified as a retirement candidate. Additional details regarding the EPR operation are described below with reference to FIG. 3.

In some embodiments, processing logic can interrupt processing host data to perform the EPR operation. However, timing can be critical because excessive processing to perform the EPR operation can increase host latency. The EPR operation can be performed in the background as a lower priority task rather than as a host operation in order to minimize latency experienced by the host. In certain embodiments, due to the short duration of the EPR operation, processing logic can identify blocks as healthy blocks that might only reliably store data for an unusably short duration (e.g., just long enough to pass the EPR operation) before subsequently failing. In such embodiments, in order to more rigorously identify a block as a healthy block, processing logic can perform operation 240, or parts of operation 240 over a longer duration (e.g., as a timed background operation), or operation 240 can be split into multiple sub-operations separated by some duration of time.

In some embodiments, in addition to using the EPR operation to identify healthy blocks, processing logic can consider memory device wear-metrics associated with the block. Wear-metrics can include representative use metrics of the memory device. One example of a wear-metric can be a program-erase count (PEC) for one or more segments of the memory device 130. Memory sub-system 110 can determine the PEC for the segment which can represent a number of times that a given segment has been programmed and erased in a cycle. Depending on the embodiment, the PEC can be an average PEC of two or more segments of the memory device 130, a highest PEC of any one segment in the block, a highest PEC of any one segment of the memory device 130, or some other representative value. The representative usage metric can also be some other information that represents how much a segment of the memory device 130 has been used, and thus how much wear and degradation the segment has experienced. In some embodiments, block health detector component 113 can maintain PEC counters for the segments of memory device 130 which are incremented in response to the occurrence of each program-erase cycle on the corresponding segment.

At operation 250, the processing logic has determined the block is a healthy block and does not retire the block. Healthy blocks can be reformatted and reused as new blocks by the memory sub-system 110. Healthy blocks can be assigned to a healthy block pool. In some embodiments, a block might be considered healthy, but after a certain duration in the healthy block pool, may exhibit signs of an unhealthy block. Additional processing logic (not pictured) may be performed with respect to healthy blocks in the healthy block pool before the healthy blocks are reformatted and reused as new blocks by the memory sub-system 110. In some embodiments, the additional processing logic performed on blocks in the healthy block pool can include all or parts of operation 240. In some embodiments, the processing logic can set a flag or change a bit in a designated register to identify the block as a healthy block.

At operation 260, the processing logic has determined the block is not a healthy block (e.g., a GBB), and retires the block. In some embodiments, GBBs can be assigned to a retirement pool. The retirement pool can process GBB retirement as a background process with minimal impact on host performance. The retirement pool can be continually processed, or can accumulate a quantity of GBBs over a period of time, and then be emptied once conditions related to the retirement pool reach respective threshold values. Conditions and respective threshold values can be based on a time the GBB has been in the retirement pool, a time since the retirement pool was empty, a quantity of GBBs in the retirement pool, or similar measurements. For example, a retirement pool might accept GBBs for a 10 minute period, and then retire all GBBs received during the 10 minute period. In another example, the retirement pool might accept GBBs and retire GBBs at a rate such that a given GBB does not spend more than 10 minutes in the retirement pool. In another example, the retirement pool can accept GBBs until it has accepted a certain number of GBBs (e.g., 10), and can then begin retiring GBBs in the retirement pool. Additional conditions and respective threshold values can apply.

FIG. 3 is a flow diagram of an example method of identifying healthy blocks in a memory sub-system with an EPR operation, in accordance with some embodiments of the present disclosure. The method 300 can be performed by processing logic that can include hardware (e.g., processing device, circuitry, dedicated logic, programmable logic, microcode, hardware of a device, integrated circuit, etc.), software (e.g., instructions run or executed on a processing device), or a combination thereof. In some embodiments, the method 300 is performed by block health detector component 113 of FIG. 1. Although shown in a particular sequence or order, unless otherwise specified, the order of the processes can be modified. Thus, the illustrated embodiments should be understood only as examples, and the illustrated processes can be performed in a different order, and some processes can be performed in parallel. Additionally, one or more processes can be omitted in various embodiments. Thus, not all processes are required in every embodiment. Other process flows are possible.

At operation 305, the processing logic (e.g., block health detector component 113) determines whether a read operation performed on a block has failed. In some embodiments, operation 305 can be optional, and processing logic can instead merely detect that a read operation with respect to a block has failed. In some embodiments, operation 305 can be included in a specific mode of the EPR operation to be performed on blocks in a drive that has exceeded the defined specifications of the drive (e.g., a certain time period and temperature range for which the data is still recoverable).

At operation 310, responsive to determining the read operation has not failed with respect to the block, the processing logic does not retire the block. The processing logic can identify the block as a healthy block. In some embodiments, similar to operation 305, operation 310 can be optional, and processing logic can instead merely be performed after a read error is detected with respect to the block.

At operation 315, the processing logic erases the block or programs the block with dummy data (e.g., diagnostic data). Memory sub-system 110 can indicate whether the erase operation performed on the block is successful with an erase status (e.g., a memory access operation status).

At operation 320, the processing logic programs the block with dummy data (e.g., diagnostic data). Memory sub-system 110 can indicate whether the program operation performed on the block is successful with a program status (e.g., a memory access operation status). In some embodiments, the diagnostic data can be pre-determined data stored in a portion of the memory sub-system 110, such as in local memory 119. In some embodiments, the diagnostic data can be automatically generated by block health detector component 113 and temporarily stored in a memory such as local memory 119 while method 300 is performed with respect to memory sub-system 110. In some embodiments, the diagnostic data can include random data.

At operation 325, the processing logic determines whether the block was successfully erased. As described above, memory sub-system 110 can indicate whether the erase operation was successful with an erase status. In some embodiments, the erase status can be a flag, a bit in a designated register, or other indication stored in a data table associated with the block. In some embodiments, operation 325 can be performed immediately following operation 315, and/or concurrently with operation 330.

At operation 330, the processing logic determines whether the block was successfully programmed. As described above, memory sub-system 110 can indicate whether the program operation was successful with program status. In some embodiments, the program status can be a flag, a bit in a designated register, or other indication stored in a data table associated with the block. In some embodiments, operation 330 can be performed immediately following operation 320, and/or concurrently with operation 325.

At operation 335, responsive to determining either the erase operation or program operation was not successful, processing logic can retire the block as an erase/program grown bad block (GBB). In some embodiments, an indication of the type of bad block that is retired (e.g., illustratively shown at this operation as an erase/program GBB) can be saved in a memory such as local memory 119. Other indications of the type of bad block are possible, at least one of which (read GBB) is further described below. In some embodiments, retirement type indications can be used to determine certain failure modes of the memory sub-system 110. In some embodiments, retirement type indications can be inaccessible to the memory sub-system controller 115, and are used only by external diagnostic tools. In some embodiments, processing logic can identify the block as a retirement candidate. Blocks can be identified at various points during method 300 as retirement candidates (e.g., at least in operations 325, 330, and 345).

At operation 340, responsive to determining both the erase operation (e.g., operation 315) and the program operation (e.g., operation 320) were successful, processing logic can attempt to read block to verify correctness of dummy data. The diagnostic read operation can include predetermined threshold tolerances of acceptable deviation from the originally programmed dummy data. In some embodiments, acceptable deviations for the diagnostic read operation can be the same as the acceptable deviations when performing a read operation in response to a host request. In the illustrative embodiment, where a program operation is performed at operation 320 following the erase operation of 315, processing logic can initiate a diagnostic read operation on the block and compare data returned by the diagnostic read operation to the originally programmed dummy data.

At operation 345, processing logic determines whether the diagnostic read operation initiated at operation 330 was successfully completed (e.g., did the diagnostic read pass). In the illustrative example, where a program operation is performed at operation 320 the diagnostic read passes if the returned data corresponds to the dummy data (e.g., diagnostic data).

At operation 350, responsive to determining the diagnostic read does not pass, processing logic retires the block as a read GBB. In some embodiments, processing logic can identify the block as a retirement candidate. Retirement candidates can be assigned to a retirement pool. Processing logic can retire blocks from the retirement pool as a background operation. In some embodiments, retiring blocks from the retirement pool can be a part of a garbage collection operation for the memory sub-system 110.

At operation 355, responsive to determining the diagnostic read does pass, the block is a healthy block, and processing logic does not retire the block as a read GBB. As described above, healthy blocks can be reformatted and reused as new blocks by the memory sub-system 110. Healthy blocks can be assigned to a healthy block pool. Additional processing logic (not pictured) may be performed with respect to healthy blocks in the healthy block pool before the healthy blocks are reused as new blocks by the memory sub-system 110. In some embodiments, the processing logic can set a flag or change a bit in a designated register to identify the block as a healthy block.

FIG. 4 is a flow diagram of an example method of identifying healthy blocks in a memory sub-system in accordance with some embodiments of the present disclosure. The method 400 can be performed by processing logic that can include hardware (e.g., processing device, circuitry, dedicated logic, programmable logic, microcode, hardware of a device, integrated circuit, etc.), software (e.g., instructions run or executed on a processing device), or a combination thereof. In some embodiments, the method 400 is performed by block health detector component 113 of FIG. 1. Although shown in a particular sequence or order, unless otherwise specified, the order of the processes can be modified. Thus, the illustrated embodiments should be understood only as examples, and the illustrated processes can be performed in a different order, and some processes can be performed in parallel. Additionally, one or more processes can be omitted in various embodiments. Thus, not all processes are required in every embodiment. Other process flows are possible.

At operation 410, processing logic (e.g., block health detector component 113) identifies a read error associated with a first block of the plurality of blocks. Although this block may appear to be a "bad block" (i.e., blocks that have failed due to deterioration of the underlying physical media), the controller can perform method 400 to determine if the block is an intrinsically good block that is able to be reformatted and reused, and merely suffered significant charge loss due to data retention stress during the extended periods of power-off time. The identification of healthy blocks in the memory sub-system prevents unnecessary retirement of intrinsically good blocks and allows for reformatting and reuse of blocks in the memory sub-system after long periods of data retention. In some embodiments, processing logic can copy data stored at the first block to a second block. This can reduce the risk of losing host data. Processing logic can copy data from the first block to the second block even if data stored at the first block would be unreadable by a read operation performed in response to a host request.

In some embodiments, processing logic can identify an error recovery flow has been performed with respect to the read error associated with the first block. Processing logic can decline to proceed to operation 420 until after the error recovery flow has finished. In some embodiments, the memory sub-system 110 can indicate that processing logic should proceed to operation 420 before an error recovery flow for the block has finished.

At operation 420, processing logic initiates a diagnostic memory access operation on the first block. In some embodiments, the diagnostic memory access operation can be a program operation. In some embodiments, the program operation can follow an erase operation. The program operation can attempt to program diagnostic data to the first block. In some embodiments, the diagnostic data can be predetermined data stored in a portion of the memory sub-system 110, such as in local memory 119. In some embodiments, the diagnostic data can be automatically generated by block health detector component 113 and temporarily stored in a memory such as local memory 119 while method 300 is performed with respect to memory sub-system 110. The diagnostic data can include random data.

At operation 430, processing logic determines whether the diagnostic memory access operation was successfully performed on the first block. As described above with reference to FIG. 3, in some embodiments the memory sub-system 110 can indicate whether the memory access operation was successful, based on processes used by the memory sub-system 110 to perform memory access operations in response to host requests.

At operation 440, in response to determining the diagnostic memory access operation was successfully performed on the first block, the processing logic initiates a diagnostic read operation on the first block. The diagnostic read operation can include predetermined threshold tolerances of acceptable deviation from the programmed diagnostic data. In some embodiments, acceptable deviations for the diagnostic read operation can be the same as the acceptable deviations when performing a read operation in response to a host request.

In response to determining the diagnostic memory access operation was not successfully performed on the first block, the processing logic identifies the first block as a memory access operation retirement candidate. Retirement candidates can be immediately retired by processing logic. In some embodiments, retirement candidates can be assigned to a retirement pool. The retirement pool can be emptied based on various factors including time duration, quantity of retirement candidates in the retirement pool, available resources, type- and number of incoming host requests, etc. In some embodiments, the retirement pool can be emptied on a regular time interval. For example, the retirement pool might accept retirement candidates for 10 minutes, and at the end of 10 minutes, empty the retirement pool by retiring each block identified as a retirement candidate. In some embodiments, blocks in the retirement pool (e.g., retirement candidates) can be retired by the memory sub-system 110 such that the blocks are assigned to the candidate retirement pool for no longer than a set duration. For example, the retirement pool might accept retirement candidates and retire blocks from the retirement pool at a rate such that no block assigned to the retirement pool is assigned to the retirement pool for longer than 10 minutes (e.g., the blocks are assigned to the pool for 10 minutes or less). In some embodiments, the retirement pool can retire blocks based on the quantity of blocks in the retirement pool. For example, the memory sub-system 110 might begin retiring blocks when the quantity of blocks in the retirement pool meets or exceeds 10 (e.g., ≥10).

Blocks identified as retirement candidates at operation 440 can be memory access operation GBBs, and can be retired alongside other types of GBBs (such as read operation GBBs described below with respect to operation 460). In some embodiments, an indication of the GBB type (e.g., here, "memory access operation" GBB) can be retained by the memory sub-system 110. GBB type indicators can be used to diagnose various failure modes or types related to the memory sub-system 110. In some embodiments, these type indications are not accessible to the memory sub-system 110, and are only used by external diagnostic tools.

At operation 450, processing logic determines whether the diagnostic read operation was successfully performed on the first block. In some embodiments where diagnostic data is programmed to the block at operation 420, processing logic can determine whether data returned by the diagnostic read operation corresponds to the diagnostic data programmed to the block.

At operation 460, in response to determining the diagnostic read operation was successfully performed on the first block, processing logic identifies the first block as a first healthy block. The processing logic can set a flag or change a bit in a designated register to identify the block as a healthy block. In some embodiments, the block can be assigned to a healthy block pool. In response to determining the diagnostic read operation was not successfully performed on the first block, processing logic can identify the first block as a read operation GBB. In some embodiments, the block can be identified as a retirement candidate. The processing logic can set a flag or change a bit in a designated register to identify the block as a retirement candidate.

Figure 5:
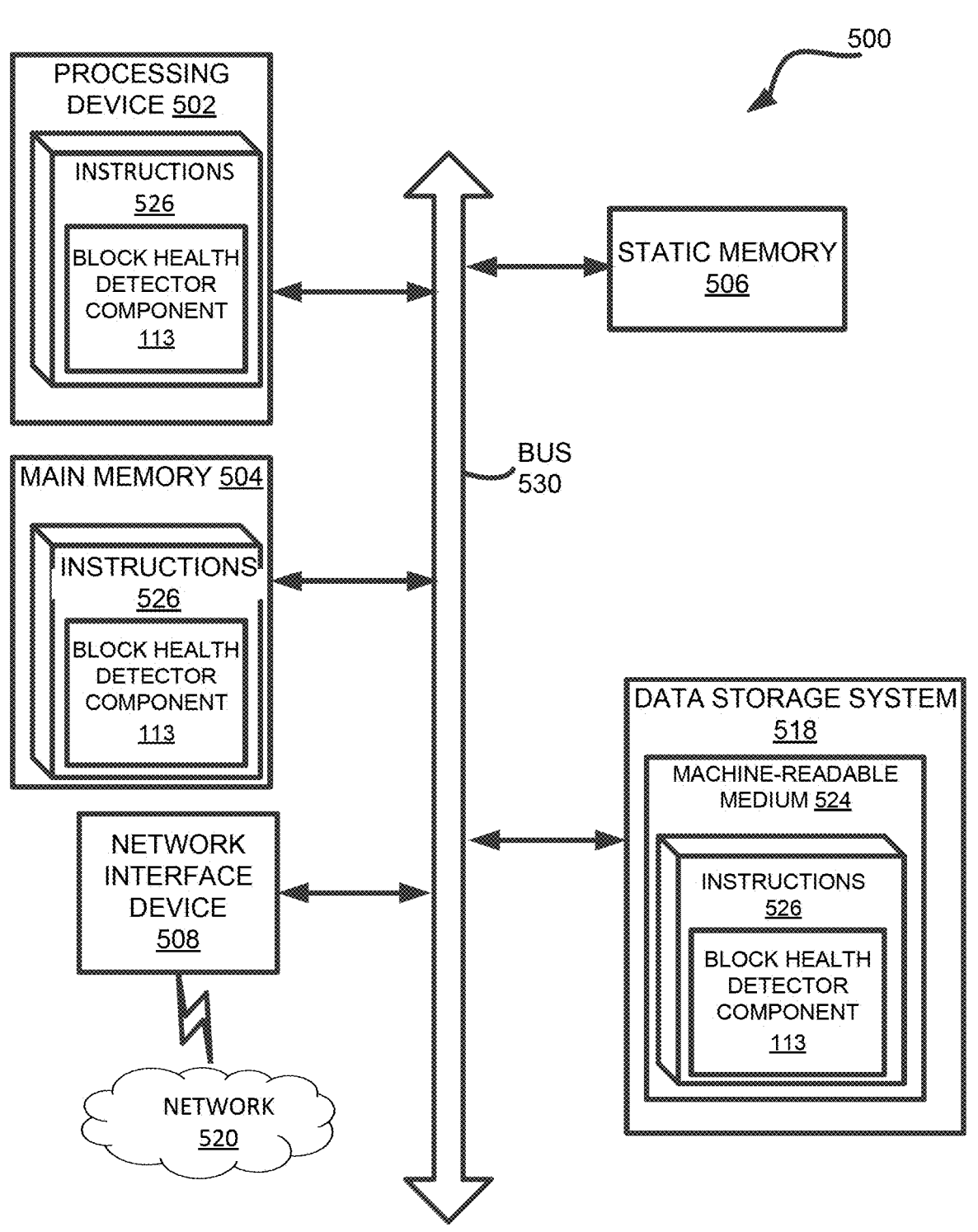
FIG. 5 is a block diagram of an example computer system in which embodiments of the present disclosure may operate.

FIG. 5 illustrates an example machine of a computer system 500 within which a set of instructions, for causing the machine to perform any one or more of the methodologies discussed herein, can be executed. In some embodiments, the computer system 500 can correspond to a host system (e.g., the host system 120 of FIG. 1) that includes, is coupled to, or utilizes a memory sub-system (e.g., the memory sub-system 110 of FIG. 1) or can be used to perform the operations of a controller (e.g., to execute an operating system to perform operations corresponding to the block health detector component 113 of FIG. 1). In alternative embodiments, the machine can be connected (e.g., networked) to other machines in a LAN, an intranet, an extranet, and/or the Internet. The machine can operate in the capacity of a server or a client machine in client-server network environment, as a peer machine in a peer-to-peer (or distributed) network environment, or as a server or a client machine in a cloud computing infrastructure or environment.

The machine can be a personal computer (PC), a tablet PC, a set-top box (STB), a Personal Digital Assistant (PDA), a cellular telephone, a web appliance, a server, a network router, a switch or bridge, or any machine capable of executing a set of instructions (sequential or otherwise) that specify actions to be taken by that machine. Further, while a single machine is illustrated, the term "machine" shall also be taken to include any collection of machines that individually or jointly execute a set (or multiple sets) of instructions to perform any one or more of the methodologies discussed herein.

The example computer system 500 includes a processing device 502, a main memory 504 (e.g., read-only memory (ROM), flash memory, dynamic random access memory (DRAM) such as synchronous DRAM (SDRAM) or Rambus DRAM (RDRAM), etc.), a static memory 506 (e.g., flash memory, static random access memory (SRAM), etc.), and a data storage system 518, which communicate with each other via a bus 530.

Processing device 502 represents one or more general-purpose processing devices such as a microprocessor, a central processing unit, or the like. More particularly, the processing device can be a complex instruction set computing (CISC) microprocessor, reduced instruction set computing (RISC) microprocessor, very long instruction word (VLIW) microprocessor, or a processor implementing other instruction sets, or processors implementing a combination of instruction sets. Processing device 502 can also be one or more special-purpose processing devices such as an application specific integrated circuit (ASIC), a field programmable gate array (FPGA), a digital signal processor (DSP), network processor, or the like. The processing device 502 is configured to execute instructions 526 for performing the operations and steps discussed herein. The computer system 500 can further include a network interface device 508 to communicate over the network 520.

The data storage system 518 can include a machine-readable storage medium 524 (also known as a computer-readable medium) on which is stored one or more sets of instructions 526 or software embodying any one or more of the methodologies or functions described herein. The instructions 526 can also reside, completely or at least partially, within the main memory 504 and/or within the processing device 502 during execution thereof by the computer system 500, the main memory 504 and the processing device 502 also constituting machine-readable storage media. The machine-readable storage medium 524, data storage system 518, and/or main memory 504 can correspond to the memory sub-system 110 of FIG. 1.

In some embodiments, the instructions 526 include instructions to implement functionality corresponding to the block health detector component 113 of FIG. 1). While the machine-readable storage medium 524 is shown in an example embodiment to be a single medium, the term "machine-readable storage medium" should be taken to include a single medium or multiple media that store the one or more sets of instructions. The term "machine-readable storage medium" shall also be taken to include any medium that is capable of storing or encoding a set of instructions for execution by the machine and that cause the machine to perform any one or more of the methodologies of the present disclosure. The term "machine-readable storage medium" shall accordingly be taken to include, but not be limited to, solid-state memories, optical media, and magnetic media.

Some portions of the preceding detailed descriptions have been presented in terms of algorithms and symbolic representations of operations on data bits within a computer memory. These algorithmic descriptions and representations are the ways used by those skilled in the data processing arts to most effectively convey the substance of their work to others skilled in the art. An algorithm is here, and generally, conceived to be a self-consistent sequence of operations leading to a desired result. The operations are those requiring physical manipulations of physical quantities. Usually, though not necessarily, these quantities take the form of electrical or magnetic signals capable of being stored, combined, compared, and otherwise manipulated. It has proven convenient at times, principally for reasons of common usage, to refer to these signals as bits, values, elements, symbols, characters, terms, numbers, or the like.

It should be borne in mind, however, that all of these and similar terms are to be associated with the appropriate physical quantities and are merely convenient labels applied to these quantities. The present disclosure can refer to the action and processes of a computer system, or similar electronic computing device, that manipulates and transforms data represented as physical (electronic) quantities within the computer system's registers and memories into other data similarly represented as physical quantities within the computer system memories or registers or other such information storage systems.

The present disclosure also relates to an apparatus for performing the operations herein. This apparatus can be specially constructed for the intended purposes, or it can include a general purpose computer selectively activated or reconfigured by a computer program stored in the computer. Such a computer program can be stored in a computer readable storage medium, such as, but not limited to, any type of disk including floppy disks, optical disks, CD- ROMs, and magnetic-optical disks, read-only memories (ROMs), random access memories (RAMs), EPROMS, EEPROMs, magnetic or optical cards, or any type of media suitable for storing electronic instructions, each coupled to a computer system bus.

The algorithms and displays presented herein are not inherently related to any particular computer or other apparatus. Various general purpose systems can be used with programs in accordance with the teachings herein, or it can prove convenient to construct a more specialized apparatus to perform the method. The structure for a variety of these systems will appear as set forth in the description below. In addition, the present disclosure is not described with reference to any particular programming language. It will be appreciated that a variety of programming languages can be used to implement the teachings of the disclosure as described herein.

The present disclosure can be provided as a computer program product, or software, that can include a machine-readable medium having stored thereon instructions, which can be used to program a computer system (or other electronic devices) to perform a process according to the present disclosure. A machine-readable medium includes any mechanism for storing information in a form readable by a machine (e.g., a computer). In some embodiments, a machine-readable (e.g., computer-readable) medium includes a machine (e.g., a computer) readable storage medium such as a read only memory ("ROM"), random access memory ("RAM"), magnetic disk storage media, optical storage media, flash memory components, etc.

In the foregoing specification, embodiments of the disclosure have been described with reference to specific example embodiments thereof. It will be evident that various modifications can be made thereto without departing from the broader spirit and scope of embodiments of the disclosure as set forth in the following claims. The specification and drawings are, accordingly, to be regarded in an illustrative sense rather than a restrictive sense.

What is claimed is:

1. A memory sub-system comprising:
   a memory device comprising a plurality of blocks of memory cells;
   a processing device, operatively coupled with the memory device, to perform operations comprising:
   identifying a read error associated with a first block of the plurality of blocks;
   initiating a diagnostic memory access operation on the first block;
   determining whether the diagnostic memory access operation was successfully performed on the first block;
   responsive to determining the diagnostic memory access operation was successfully performed on the first block, initiating a diagnostic read operation on the first block;
   determining whether the diagnostic read operation was successfully performed on the first block; and
   responsive to determining the diagnostic read operation was successfully performed on the first block, identifying the first block as a first healthy block.

2. The memory sub-system of claim 1 wherein initiating the diagnostic memory access operation on the first block comprises:
   erasing the first block of the plurality of blocks; and
   programming diagnostic data to the first block of the plurality of blocks.

3. The memory sub-system of claim 2, wherein determining whether the diagnostic read operation was successfully performed on the first block further comprises:

determining whether data returned by the diagnostic read operation corresponds to the diagnostic data.

4. The memory sub-system of claim 1, wherein identifying the first block as the first healthy block comprises:

assigning the first block to a healthy block pool.

5. The memory sub-system of claim 1, further comprising:

copying data stored at the first block of the plurality of blocks to a second block of the plurality of blocks.

6. The memory sub-system of claim 1, further comprising:

responsive to determining the diagnostic memory access operation was not successfully performed on the first block of the plurality of blocks, identifying the first block as a retirement candidate.

7. The memory sub-system of claim 1, further comprising:

responsive to determining the diagnostic read operation was not successfully performed on the first block of the plurality of blocks, identifying the first block as a retirement candidate.

8. A method comprising:

identifying a read error associated with a first block of a plurality of blocks of a memory device;

initiating a diagnostic memory access operation on the first block;

determining whether the diagnostic memory access operation was successfully performed on the first block;

responsive to determining the diagnostic memory access operation was successfully performed on the first block, initiating a diagnostic read operation on the first block;

determining whether the diagnostic read operation was successfully performed on the first block; and responsive to determining the diagnostic read operation was successfully performed on the first block, identifying the first block as a healthy block.

9. The method of claim 8 wherein initiating the diagnostic memory access operation on the first block comprises:

erasing the first block of the plurality of blocks; and programming diagnostic data to the first block of the plurality of blocks.

10. The method of claim 9, wherein determining whether the diagnostic read operation was successfully performed on the first block further comprises:

determining whether data returned by the diagnostic read operation corresponds to the diagnostic data.

11. The method of claim 8 further comprising:

assigning the first block to a healthy block pool.

12. The method of claim 8, further comprising:

copying data stored at the first block of the plurality of blocks to a second block of the plurality of blocks.

13. The method of claim 8, further comprising:

responsive to determining the diagnostic memory access operation was not successfully performed on the first block of the plurality of blocks, identifying the first block as a retirement candidate.

14. The method of claim 8, further comprising:

responsive to determining the diagnostic read operation was not successfully performed on the first block of the plurality of blocks, identifying the first block as a retirement candidate.

15. A non-transitory computer-readable storage medium comprising instructions that, when executed by a processing device, cause the processing device to perform operations comprising:

identifying a read error associated with a first block of a plurality of blocks of a memory device;

initiating a diagnostic memory access operation on the first block;

determining whether the diagnostic memory access operation was successfully performed on the first block;

responsive to determining the diagnostic memory access operation was successfully performed on the first block, initiating a diagnostic read operation on the first block;

determining whether the diagnostic read operation was successfully performed on the first block; and responsive to determining the diagnostic read operation was successfully performed on the first block, identifying the first block as a healthy block.

16. The non-transitory computer-readable storage medium of claim 15 wherein initiating the diagnostic memory access operation on the first block comprises:

erasing the first block of the plurality of blocks; and programming diagnostic data to the first block of the plurality of blocks.

17. The non-transitory computer-readable storage medium of claim 16 wherein determining whether the diagnostic read operation was successfully performed on the block further comprises:

determining whether data returned by the diagnostic read operation corresponds to the diagnostic data.

18. The non-transitory computer-readable storage medium of claim 15, further comprising:

copying data stored at the first block of the plurality of blocks to a second block of the plurality of blocks.

19. The non-transitory computer-readable storage medium of claim 15, further comprising:

responsive to determining the diagnostic memory access operation was not successfully performed on the first block of the plurality of blocks, identifying the first block as a retirement candidate.

20. The non-transitory computer-readable storage medium of claim 15, further comprising:

responsive to determining the diagnostic read operation was not successfully performed on the first block of the plurality of blocks, identifying the first block as a retirement candidate.

* * * * *